(12) United States Patent
Mak et al.

(10) Patent No.: US 10,739,382 B2
(45) Date of Patent: Aug. 11, 2020

(54) TESTING APPARATUS HAVING A CONFIGURABLE PROBE FIXTURE

(71) Applicant: Keysight Technologies, Inc., Santa Rosa, CA (US)

(72) Inventors: Daniel Mak, Singapore (SG); Dominique Tan, Singapore (SG); Mei Siem Wong, Singapore (SG)

(73) Assignee: Keysight Technologies, Inc., Santa Rosa, CA (US)

( * ) Notice: Subject to any disclaimer, the term of this patent is extended or adjusted under 35 U.S.C. 154(b) by 23 days.

(21) Appl. No.: 16/134,232

(22) Filed: Sep. 18, 2018

(65) Prior Publication Data

US 2020/0088765 A1    Mar. 19, 2020

(51) Int. Cl.
*G01R 1/07* (2006.01)
*G01R 1/073* (2006.01)
*G01R 31/28* (2006.01)

(52) U.S. Cl.
CPC ..... *G01R 1/07364* (2013.01); *G01R 31/2808* (2013.01)

(58) Field of Classification Search
CPC ............ G01R 1/07328; G01R 1/07378; G01R 31/2808
See application file for complete search history.

(56) References Cited

U.S. PATENT DOCUMENTS

| | | |
|---|---|---|
| 4,340,858 A | 7/1982 | Malloy |
| 5,276,395 A | 1/1994 | Malloy |
| 7,400,135 B1* | 7/2008 | Bartholomew .... G01R 31/2808 324/763.01 |
| 7,956,629 B2 | 6/2011 | Root |
| 8,004,296 B2 | 8/2011 | Di Stefano |
| 2003/0030459 A1* | 2/2003 | Sabey ................ G01R 31/2805 324/750.19 |
| 2007/0075713 A1* | 4/2007 | Liu ........................ G01R 31/50 324/750.01 |
| 2009/0015284 A1* | 1/2009 | Blouin ............... G01R 31/2808 324/754.14 |
| 2009/0289646 A1* | 11/2009 | Chen ................... G01R 1/06761 324/755.01 |
| 2010/0201386 A1* | 8/2010 | Roelvink ........... G01R 31/2808 324/756.07 |
| 2011/0148448 A1* | 6/2011 | St. Onge ............ G01R 1/07328 324/755.01 |
| 2014/0248113 A1 | 9/2014 | Phillips |

* cited by examiner

*Primary Examiner* — Alvaro E Fortich

(57) ABSTRACT

Illustrative embodiments disclosed herein pertain to a testing apparatus for performing in-circuit tests upon a printed circuit board assembly. Each of these tests may require the use of a set of probes arranged in a customized layout. This is traditionally accomplished by using a set of predefined probe plates, some or all of which may include probes that are either redundant or duplicated amongst the various probe plates, thereby introducing an undesirable cost penalty. A testing apparatus in accordance with the disclosure incorporates a configurable probe fixture that includes a docking plate configured to support a first set of probe modules for carrying out a first test upon a printed circuit board assembly. Some or all of the probe modules can then be selectively removed or replaced by other probe modules for reconfiguring the testing apparatus to carry out other tests upon the printed circuit board assembly.

19 Claims, 10 Drawing Sheets

TESTING APPARATUS HAVING A CONFIGURABLE PROBE FIXTURE

BACKGROUND

Printed circuit board assemblies are ubiquitously employed in a wide range of products ranging from mass scale consumer products to sophisticated instruments used for specialized applications. It is highly desirable that printed circuit board assemblies, particularly ones that are used in mass scale consumer products, are manufactured in a cost-effective manner and are highly reliable to operate. Towards this end, most manufacturers of printed circuit board assemblies use automated machinery that execute various functions such as picking and placing components upon a printed circuit board, followed by soldering these components upon the printed circuit board. The completed printed circuit board assembly is then inspected for quality by various types of inspection machines that carry out the inspection in a very rapid and efficient manner. One of these inspection machines is known in the industry as a bed-of-nails tester. The bed-of-nails tester is used to test the integrity of various soldered connections as well as to detect certain types of failures in the components mounted upon the printed circuit board.

The types of testing performed by the bed-of-nails tester is traditionally referred to as in-circuit testing and includes various functional tests to evaluate various circuit functions of the printed circuit board assembly and continuity tests that are used to check for abnormal connections such as short circuits and/or open circuits. A short circuit condition can occur for example, when an excessive amount of solder causes a solder bridge to be formed between two solder pads on the printed circuit board assembly. Abnormal open circuit conditions can occur for example, when no solder is applied to a solder pad, or when an inadequate amount of heat is applied for melting the solder on to the solder pad.

A typical bed-of-nails tester includes various fixtures and mounting elements to ensure reliable contact between spring-loaded probes and solder pads (or test nodes) located on a bottom surface and/or a top surface of a printed circuit board assembly that is to be tested. The spring-loaded probes are typically provided in the form of a set of probes mounted on a probe plate. Each probe assembly includes a spring-loaded probe pin that extends through a sleeve and makes contact against the solder pad or test node on the printed circuit board assembly when the bed-of-nails tester is placed in operation. The sleeve is mounted in a through-hole in the probe plate and may have a square tail that is accessible from below the probe plate. A wire that is wire-wrapped to this square tail is used for conveying electrical signals between the bed-of-nails tester and a test instrument such as a continuity tester or a signal generator for performing a functional test upon the printed circuit board assembly.

A printed circuit board assembly may contain a large number of solder pads on a bottom surface and it is feasible that the bed of nails tester be provided with an equal number of probes. However, this is generally undesirable because costs associated with using all the solder pads on the bottom surface of a printed circuit board assembly for test purposes, irrespective of the relevance of individual solder pads to the functionality of the printed circuit board assembly being tested, can be prohibitive and unnecessary. Consequently, a traditional test procedure involves identifying a first set of solder pads to be accessed for performing a first type of test, such as a continuity test, upon the printed circuit board assembly. A first probe plate having a first set of probes is accordingly provided for carrying out the continuity test. A second set of solder pads may then be identified for performing a second type of test, such as a functionality test of the printed circuit board assembly. The first probe plate is removed and replaced by a second probe plate having a second set of probes for carrying out the functionality test. An undesirable cost penalty in terms of duplication and redundancy may be incurred as a result of duplicating various elements of the first probe plate in the second probe plate.

Such costs are exacerbated if the test procedure further involves performing additional tests upon the printed circuit board assembly, such as additional functionality tests. Each of these additional functionality tests involves an entire replacement of one probe plate that is customized for carrying out one type of functionality test with another probe plate that is customized for carrying out another type of functionality test.

The traditional test procedure also suffers from a lack of flexibility in terms of allowing changes to be carried out in the tests conducted upon the printed circuit board assembly. For example, a change in a functionality test may involve modifying the number (and locations) of the solder pads used for carrying out the changed functionality test. Accordingly, the probe plate used previously for carrying out the test has to be either discarded or modified in order to match the modified set of solder pads. The replacement process (or modification process) is not only time consuming, which adds to the overall cost of testing the printed circuit board assembly, but also introduces other costs such as design cost, labor costs, manufacturing costs, and wastage costs.

SUMMARY

According to one exemplary embodiment of the disclosure, a testing apparatus includes a mounting plate, a base plate, a docking plate, and a first probe module. The mounting plate has a top major surface adapted for removably mounting a printed circuit board assembly and includes a first set of perforations extending from the top major surface of the mounting plate to a bottom major surface of the mounting plate. The base plate is configured to support the mounting plate on one or more support members that extend between the bottom major surface of the mounting plate and a top major surface of the base plate. The docking plate is mounted upon the base plate and includes a second set of perforations extending from a top major surface of the docking plate to a bottom major surface of the mounting plate. The first probe module includes a first enclosure, a first probe plate, a probe pin, a connecting wire, and a bottom cover. The first enclosure has a first connector mounted upon a first wall of the first enclosure, the first connector having a set of leads exposed to an interior portion of the first enclosure and a corresponding set of contacts exposed outside the first enclosure. The first probe plate is operative as a top cover of the first enclosure and supports a first set of probes. The first set of probes includes at least one probe having a probe pin. The probe pin has a proximal end arranged to pass through a first perforation in the first set of perforations in the mounting plate and touch a first test point on a bottom major surface of the printed circuit board assembly. A connecting wire is connected between a distal end of the probe pin and a first lead in the set of leads of the first connector. The bottom cover is attached to a bottom portion of the first enclosure and includes two alignment pegs arranged to pass through a first pair of perforations in the second set of perforations in the docking plate for alignedly mounting the first probe module upon the docking plate.

According to another exemplary embodiment of the disclosure, a testing apparatus includes a first probe module. The first probe module has a first enclosure with a first connector mounted upon a first wall of the first enclosure. The first connector has a set of leads exposed to an interior portion of the first enclosure and a corresponding set of contacts exposed outside the first enclosure. A first probe plate is operative as a top cover of the first enclosure and supports a first set of probes. The first set of probes including at least a first probe having a probe pin. The probe pin has a proximal end arranged to pass through a first perforation in a first set of perforations in a mounting plate and touch a first test point on a bottom major surface of a printed circuit board assembly that is mounted upon the mounting plate. A connecting wire is connected between a distal end of the probe pin and a first lead in the set of leads of the first connector.

According to yet another exemplary embodiment of the disclosure, a method includes placing a printed circuit board assembly upon a top major surface of a mounting plate that is a part of a testing apparatus; placing a first probe module upon a docking plate that is located below the mounting plate; moving down the mounting plate, whereby a proximal end of a probe pin of a first probe that is mounted in a top cover of the first probe module passes through a first perforation in the first set of perforations in the mounting plate and touches a first test point on a bottom major surface of the printed circuit board assembly; and executing a first test procedure upon the printed circuit board assembly, the first test procedure comprising propagating one or more test signals through at least the probe pin of the first probe to the printed circuit board assembly.

Other embodiments and aspects of the disclosure will become apparent from the following description taken in conjunction with the following drawings.

BRIEF DESCRIPTION OF THE FIGURES

Many aspects of the invention can be better understood by referring to the following description in conjunction with the accompanying claims and figures. Like numerals indicate like structural elements and features in the various figures. For clarity, not every element may be labeled with numerals in every figure. The drawings are not necessarily drawn to scale; emphasis instead being placed upon illustrating the principles of the invention. The drawings should not be interpreted as limiting the scope of the invention to the example embodiments shown herein.

DETAILED DESCRIPTION

Figure 1:
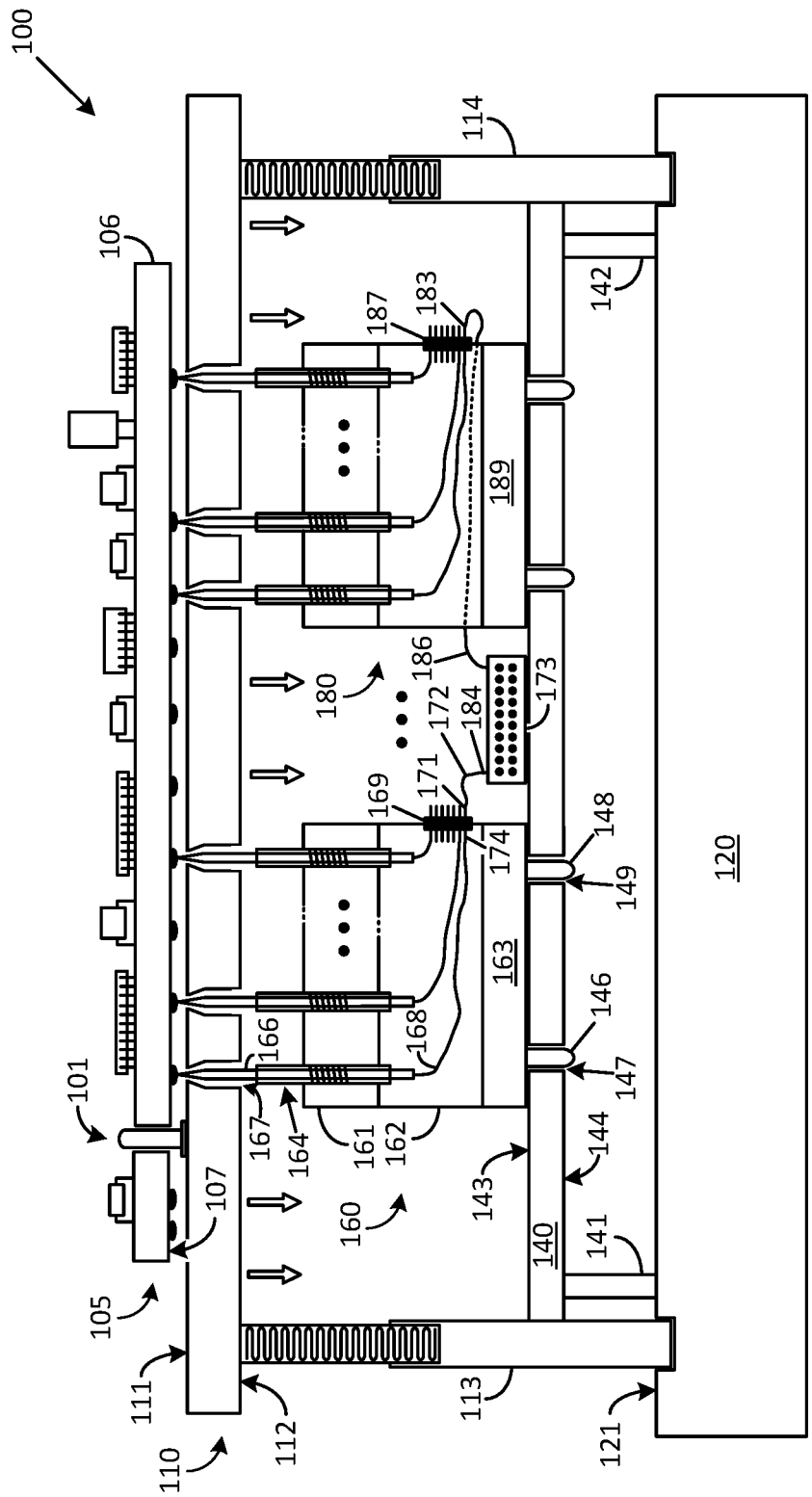
FIG. 1 shows a functional illustration of an exemplary testing apparatus that may be used to test printed circuit board assemblies in accordance with an embodiment of the disclosure.

Throughout this description, embodiments and variations are described for the purpose of illustrating uses and implementations of inventive concepts. The illustrative description should be understood as presenting examples of inventive concepts, rather than as limiting the scope of the concepts as disclosed herein. Towards this end, certain words and terms are used herein solely for convenience and such words and terms should be broadly understood as encompassing various objects and actions that are generally understood in various forms and equivalencies by persons of ordinary skill in the art. For example, various words such as "top" and "bottom," which are used herein to indicate relative orientations and/or relative locations, should not necessarily be interpreted as absolute orientations and locations. For example, a "bottom" end of an object that is shown in an upright position in an exemplary illustration of the object, can be located on a side of the object when the object is placed in a horizontal position. As another example, the phrase "solder pad" that is used herein generally refers to any electrically conductive element on a printed circuit board that can be used for carrying out in-circuit testing. Words such as "holes" and "perforations" may be construed suitably in various other equivalent ways (such as a "notch" or an "indentation") in various embodiments. Words such as "post" or "peg" may be construed suitably in various other equivalent ways in various embodiments. As yet another example, the word "pin" as used herein is interchangeable with various other words such as "terminal," "contact," or "lead." The words "substantial" or "substantially" as used herein are indicative of practical tolerances that come into play when applying certain procedures such as when matching the shape of one object to another or when fabricating one object that is identical to another. For example, practical tolerances may dictate that the curvature of one object may be slightly different than the curvature of another object (by a few millimeters, for example) when the shapes of these two objects are "substantially matched" or "substantially similar." Such tolerances can be understood by persons of ordinary skill in the art. Furthermore, the word "example" as used herein is intended to be non-exclusionary and non-limiting in nature. More particularly, the word "exemplary" as used herein indicates one among several examples and it should be understood that no special emphasis, exclusivity, or preference, is associated or implied by the use of this word.

In terms of a general overview, the various illustrative embodiments disclosed herein pertain to a testing apparatus for performing various in-circuit tests upon a printed circuit board assembly. Each of these in-circuit tests may require the use of a set of probes arranged in a customized layout that matches the layout of specific set of solder pads on the bottom surface of the printed circuit board assembly. This is traditionally accomplished by using a predefined probe plate for each test. Some or all of these customized probe plates may include probes that are either redundant or duplicated amongst the various probe plates, thereby introducing an undesirable cost penalty to the testing of the printed circuit board assembly. The testing apparatus disclosed herein incorporates a configurable probe structure and in accordance with the various embodiments described herein, the configurable probe structure may include several probe modules. A first set of probe modules may be used for carrying out a first type of test upon a printed circuit board assembly. Some or all of the probe modules can then be selectively removed or replaced by other probe modules to form a second set of modules that is used for carrying out a second type of test upon the printed circuit board assembly. The use of such probe modules provides for a more expeditious and more economical testing of the printed circuit board assembly in comparison to traditional systems and methods.

FIG. 1 shows a functional illustration of a testing apparatus 100 that can be used to test printed circuit board assemblies in accordance with an embodiment of the disclosure. An exemplary printed circuit board assembly 105 includes various components such as resistors, capacitors, and integrated circuits that are soldered upon a printed circuit board 106. The printed circuit board 106 is removably mounted at a preset location upon a mounting plate 110 of the testing apparatus 100 by using a mounting procedure that may include the use of various fixtures such as clamps and mounting posts to ensure that the printed circuit board 106 is accurately aligned with respect to the mounting plate 110. Various holes are provided in the printed circuit board 106 for accommodating various mounting posts, such as a hole that is shown for accommodating an exemplary mounting post 101.

The mounting plate 110 has a set of perforations extending from a bottom major surface 112 of the mounting plate 110 to a top major surface 111 of the mounting plate 110 for removably mounting the printed circuit board assembly 105. In this exemplary embodiment, each perforation includes a cylindrical portion extending from the bottom major surface 112 to an intermediate location inside the mounting plate 110. The cylindrical portion transitions into a tapered portion that extends from the intermediate location to the top major surface 111 of the mounting plate 110. A diameter of the cylindrical portion is selected to accommodate slideable passage of a probe pin towards a solder pad on the bottom major surface 107 of the printed circuit board assembly 105. The tapered portion guides the probe pin into alignment with the solder pad when the mounting plate 110 is pressed downwards by using other components of the testing apparatus 100 such as a hinged lid (not shown).

The testing apparatus 100 includes a base plate 120 having a top major surface 121 configured to support the mounting plate 110 on one or more support members that extend between the bottom major surface 112 of the mounting plate 110 and the top major surface 121 of the base plate 120. In this exemplary implementation, the support members include a first spring-loaded pillar 113 and a second spring-loaded pillar 114, which accommodate the downwards movement of the mounting plate 110.

The testing apparatus 100 further includes a configurable probe fixture in the form of a docking plate 140 configured to support "n" (n≥1) probe modules, such as a first probe module 160 and a second probe module 180 that are shown as examples. The docking plate 140 is supported on the base plate 120 by one or more support members. In this exemplary implementation, the support members include a first 141 and a second pillar 142. The docking plate 140 includes a number of perforations that extend from a top major surface 143 of the docking plate 140 to a bottom major surface 144 of the docking plate 140. A connector 173 is mounted upon the top major surface 143 of the docking plate 140. The connector 173 may be used to connect the testing apparatus 100 to external instruments (not shown) such as a continuity tester or a functional tester.

The first probe module 160 includes an enclosure 162 having a bottom cover 163 and a top cover 161. The top cover 161 is operative as a probe plate and supports a first set of "m" (m≥1) probes. The first set of probes includes an exemplary probe 164 that is mounted in the probe plate 161 and includes a probe pin 166 having a proximal end arranged to pass through a first perforation 167 in the set of perforations extending from the bottom major surface 112 of the mounting plate 110 to the top major surface 111 of the mounting plate 110. The probe pin 166 touches a solder pad that is a first test point on the bottom major surface 107 of the printed circuit board assembly 105. A connecting wire 168 is connected between a distal end of the probe 164 and a first lead 174 in a connector 169 that is mounted upon a wall of the enclosure 162. The first lead 174 is one of several leads that are exposed to an interior portion of the enclosure 162. Additional connecting wires are similarly connected between the distal end of each of the other probes located on the top cover 161 and the other leads in the connector 169. The connector 169 has a corresponding set of contacts that are exposed outside the enclosure 162.

In an exemplary implementation, the connector 169 is a wire wrap terminal wherein each of the leads that are exposed to the interior portion of the enclosure 162 and each of the set of contacts that are exposed outside the enclosure 162 is a wire wrap terminal. A connecting wire 172 has one end wire-wrapped to a first contact 171 in the set of contacts of the connector 169 and another end connected to a pin 184 of the connector 173 that is mounted upon the top major surface 143 of the docking plate 140. The connection between the connecting wire 172 and the pin 184 of the connector 173 may be a wire wrapped connection when the pin 184 of the connector 173 is a wire wrap terminal and may be a soldered connection when the pin 184 of the connector 173 is a solderable pin.

In another exemplary implementation, each of the leads that are exposed to the interior portion of the enclosure 162 are wire-wrap leads and the set of contacts that are exposed outside the enclosure 162 are located inside a connector housing that permits connector 169 to be mated with another connector (not shown).

In this exemplary embodiment, the bottom cover 163 of the first probe module 160 includes a first alignment peg 146 and a second alignment peg 148 that is located diagonally opposed to the first alignment peg 146. The first probe module 160 is placed upon the docking plate 140 by inserting the first alignment peg 146 into a first perforation 147 and inserting the second alignment peg 148 into a second perforation 149 in the set of perforations extending from the top major surface 143 of the docking plate 140 to the bottom major surface 144 of the docking plate 140. Additional pegs may be provided in the bottom cover 163 of the first probe module 160 and inserted into additional perforations in the docking plate 140.

The configuration and structure of the second probe module 180 may be substantially similar to the configuration and structure of the first probe module 160 that is described above and will not be repeated here. A connecting wire 186 has one end wire-wrapped to a first contact 183 in a set of contacts of a connector 187 that may be similar to the connector 169. Another end of the connecting wire 186 is connected to a second pin of the connector 173 that is mounted upon the top major surface 143 of the docking plate 140. Connecting wires from other probe modules (not shown) are similarly connected to the connector 173. The connector 173 is adapted to engage with a connector that is a part of a test instrument (not shown). For example, the connector 173 may be a multi-pin female connector and the test instrument may include a cable having a multi-pin male connector that is mated with the multi-pin female connector for coupling the test instrument to the testing apparatus 100.

The testing apparatus 100 may include other hardware elements that are known in the art and such elements are not addressed herein so as to avoid distracting from certain aspects that are more directly pertinent to the disclosure.

Figure 2:
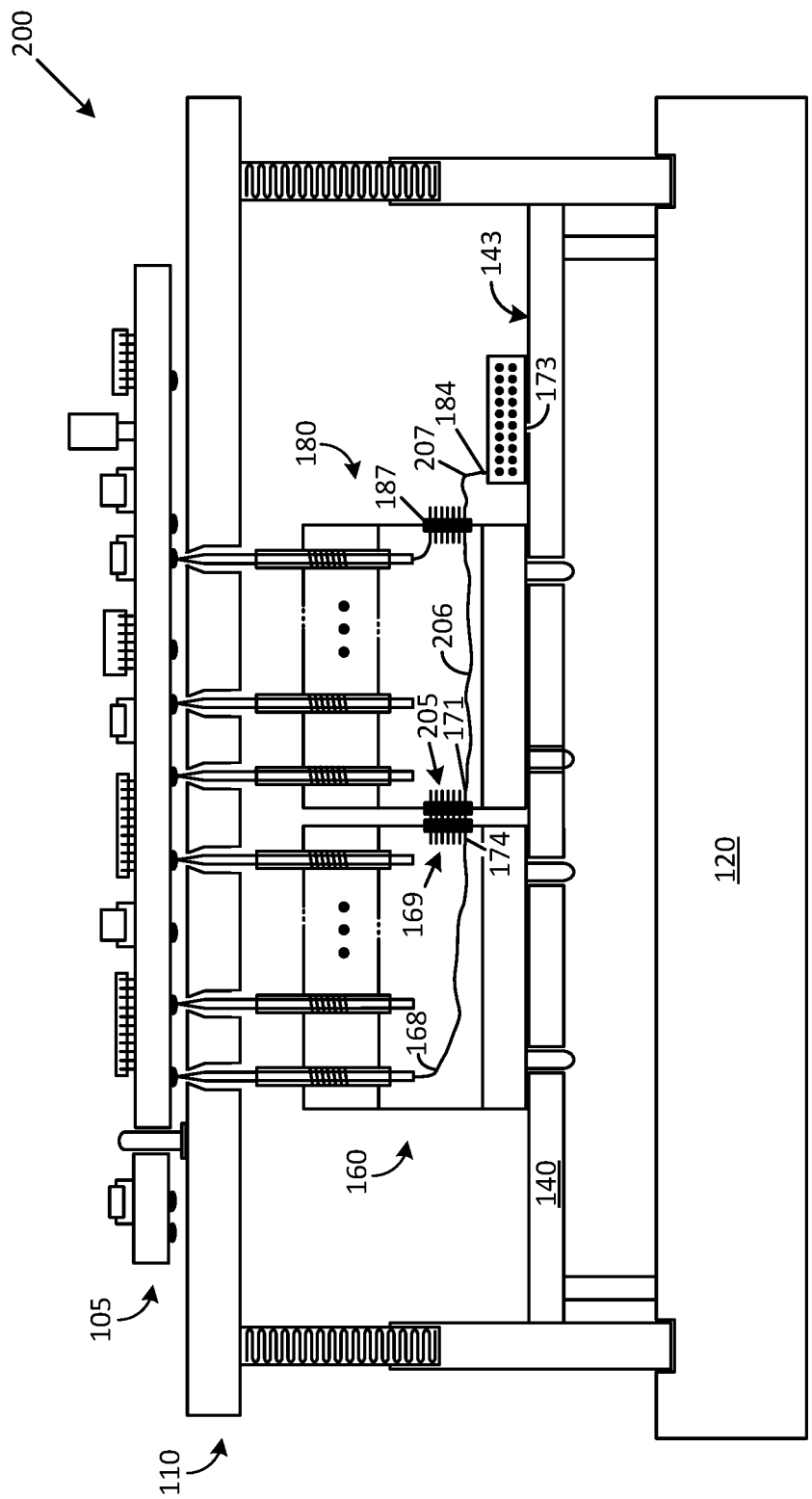
FIG. 2 shows a functional illustration of another exemplary testing apparatus in accordance with an embodiment of the disclosure.

FIG. 2 shows a functional illustration of a testing apparatus 200 that can be used to test the printed circuit board assembly 105 in accordance with another embodiment of the disclosure. In this exemplary embodiment, the second probe module 180 includes a connector 205 that is mounted on a wall that runs substantially parallel to the wall upon which the connector 187 is mounted. The connector 205 is adapted for mating with the connector 169 that is mounted on the wall of the enclosure 162 of the first probe module 160. For example, the connector 205 may be a plug-type connector when the connector 169 is a socket type connector.

As described above, the connecting wire 168 is connected between a distal end of the probe 164 and a first lead 174 in the connector 169. However, the first contact 171 of the connector 169 is not directly connected to the first pin 184 of the connector 173 that is mounted upon the top major surface 143 of the docking plate 140. The connection is instead routed to a lead of the connector 187 via the connector 169, the connector 205, and a connecting wire 206 in the second probe module 180. A corresponding contact of the connector 187 is connected to the connector 173 that is mounted upon the top major surface 143 of the docking plate 140 via a connecting wire 207.

The connecting wires of some or all of the remaining probes in the first probe module 160 are similarly connected to the connector 173 via the connector 169, connector 205, and connector 187. The connecting wires of some or all of the probes in the second probe module 180 are routed to the connector 173 directly via the connector 187.

The wire connections between the probes in the first probe module 160 and the connector 173 that is mounted upon the top major surface 143 of the docking plate 140 may be routed through one or more additional probe modules in another exemplary implementation. Furthermore, in another embodiment, the connector 205 may be mounted on a second wall that is orthogonal to the first wall upon which the connector 187 is mounted, and mated with the connector 169 in the first probe module 160. In yet another embodiment, more than one connector may be mounted on one of more walls of the first probe module 160 and/or the second probe module 180.

Figure 3:
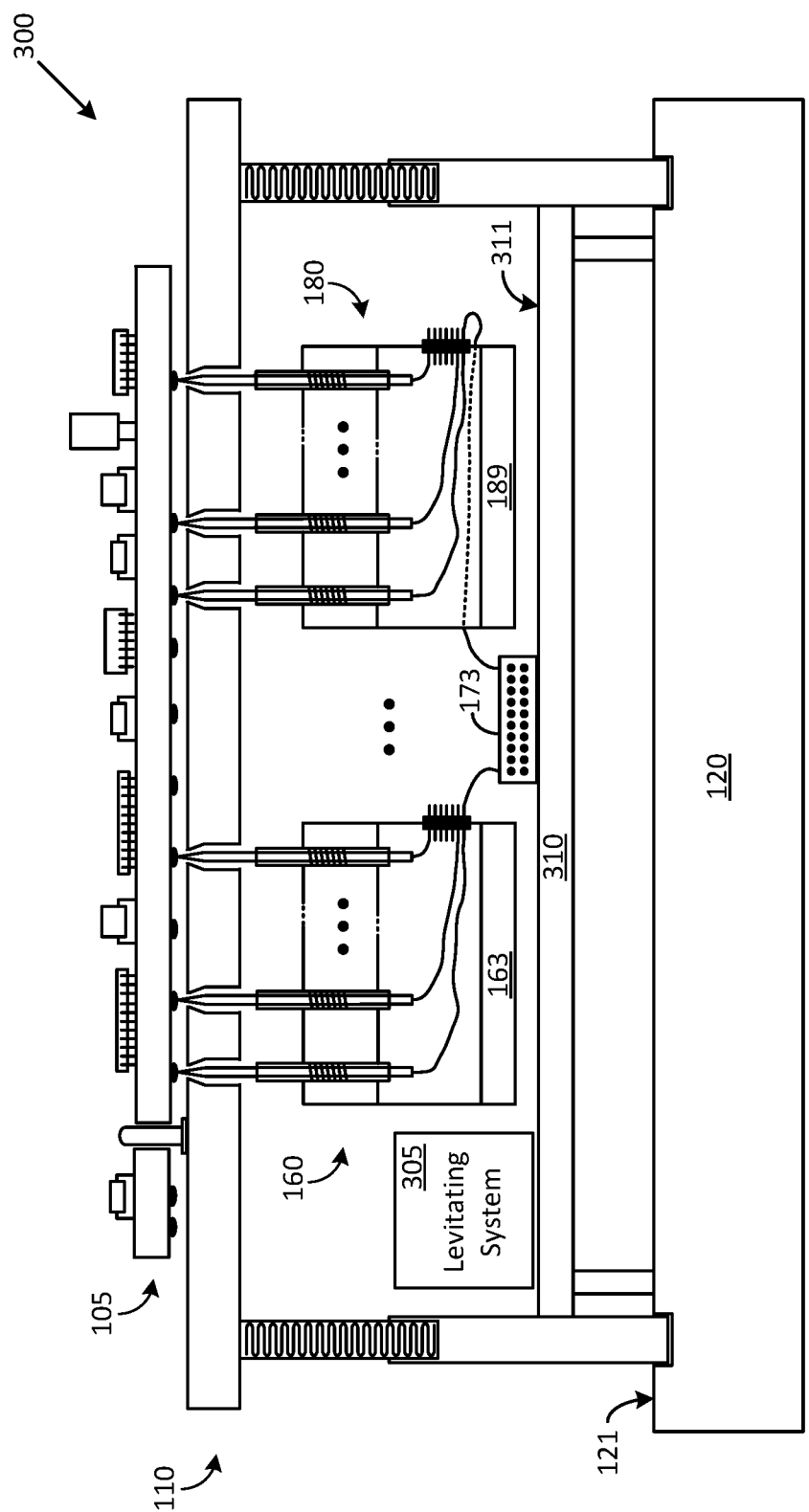
FIG. 3 shows a functional illustration of yet another exemplary testing apparatus in accordance with an embodiment of the disclosure.

FIG. 3 shows a functional illustration of an exemplary testing apparatus 300 that can be used to test the printed circuit board assembly 105 in accordance with yet another embodiment of the disclosure. Testing apparatus 300 includes an electro-magnetic levitation system 305 and a docking plate 310 that is configured to operate in cooperation with the electro-magnetic levitation system 305. In this exemplary implementation, the electro-magnetic levitation system 305 and the connector 173 are mounted upon a top major surface 311 of the docking plate 310. In another exemplary implementation, the electro-magnetic levitation system 305 and/or the connector 173 may be mounted at other locations in the testing apparatus 300, such as upon the top major surface 121 of the base plate 120.

The electro-magnetic levitation system 305 can be utilized to place one or more of the probe modules, such as the first probe module 160 and the second probe module 180, in a hovering state above the top major surface 311 of the docking plate 310. One example of the electro-magnetic levitation system 305 is a magnetic levitation stage with planar motor that is offered by Philips®. The bottom cover of each probe module, such as the bottom cover 163 of the first probe module 160 and the bottom cover 189 of the second probe module 180, may include hardware (not shown) adapted to function with the electro-magnetic levitation system 305.

The electro-magnetic levitation system 305 may be programmed to place the first probe module 160 at a first location above the top major surface 311 of the docking plate 310 and the second probe module 180 at a second location above the top major surface 311 of the docking plate 310, for conducting a first test upon the printed circuit board assembly 105. During, or after, the test, the electro-magnetic levitation system 305 may be programmed to automatically reposition the first probe module 160 (and/or the second probe module 180) at a different location above the top major surface 311 of the docking plate 310 without manual intervention, for conducting one or more other tests upon the printed circuit board assembly 105.

Figure 4:
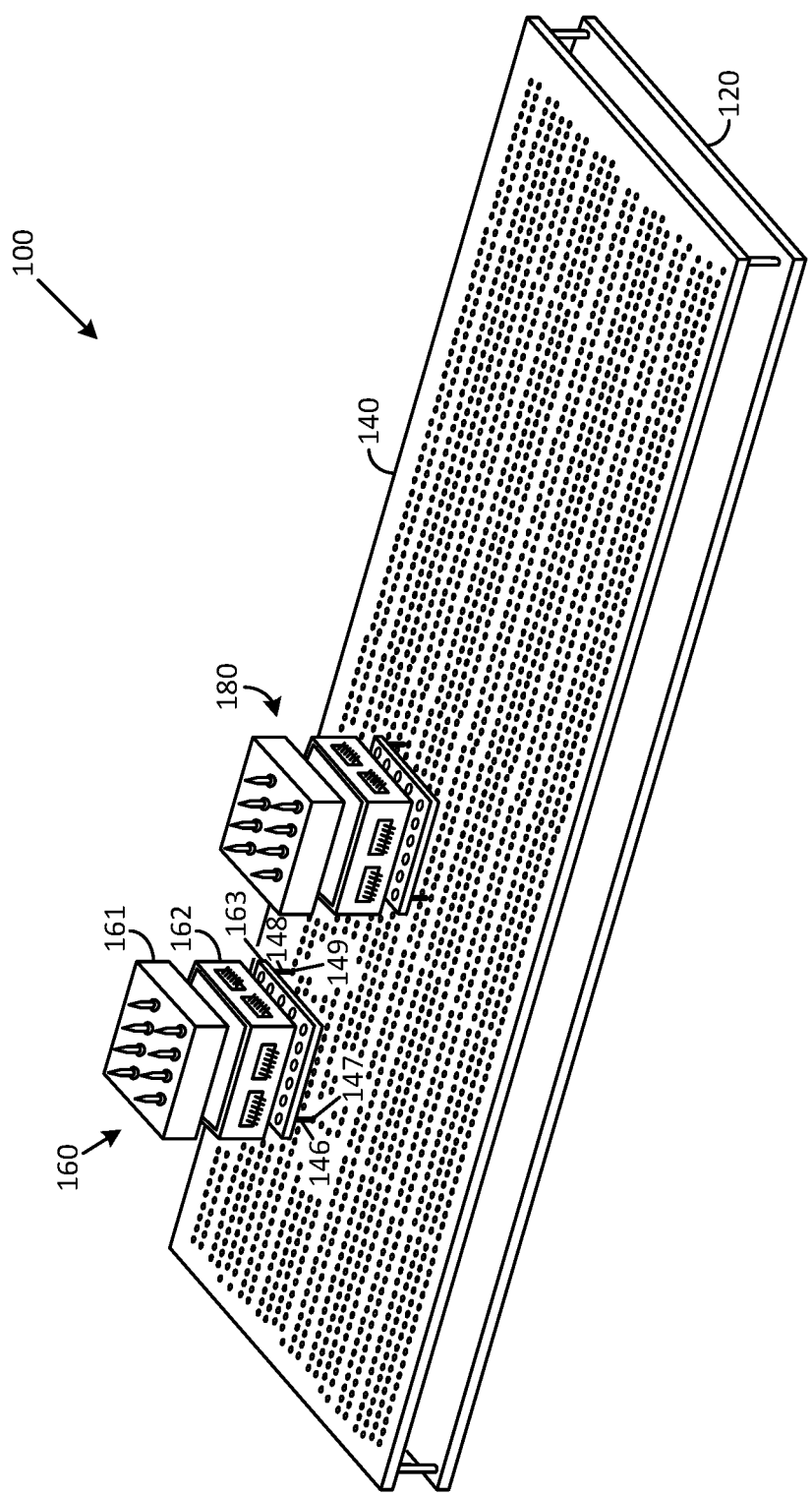
FIG. 4 shows a perspective view of the exemplary testing apparatus shown in FIG. 1.

FIG. 4 shows a perspective view of the exemplary testing apparatus 100 shown in FIG. 1. The first probe module 160 may be manually placed at a first location upon the docking plate 140 by inserting at least the first alignment peg 146 into the first perforation 147 and the second alignment peg 148 into the second perforation 149 in the set of perforations extending from the top major surface 143 of the docking plate 140 to the bottom major surface 144 of the docking plate 140. The first alignment peg 146 is located diagonally opposed to the second alignment peg 148 and this pair of alignment pegs thereby providing alignment to the first probe module 160 along an x-axis as well as a y-axis of the docking plate 140. The x-axis extends longitudinally to the docking plate 140. Alignment pegs in addition to the first alignment peg 146 and the second alignment peg 148 may be provided in the bottom cover 163 of the first probe module 160. In this exemplary implementation, the enclosure 162 of the first probe module 160 includes two connectors on a first wall and another two connectors on a second wall.

The configuration and structure of the second probe module 180 may be substantially similar to the configuration and structure of the first probe module 160. The second probe module 180 may be manually placed at a second location upon the docking plate 140. Each of the first location upon which the first probe module 160 and the second location upon which the second probe module 180 is placed may be defined by a nature of a test and a location of a set of solder pads on the bottom major surface 107 of the printed circuit board assembly 105, wherein the set of solder pads are used for carrying out the test. Additional probe modules may be manually placed upon other locations on the docking plate 140.

Figure 5:
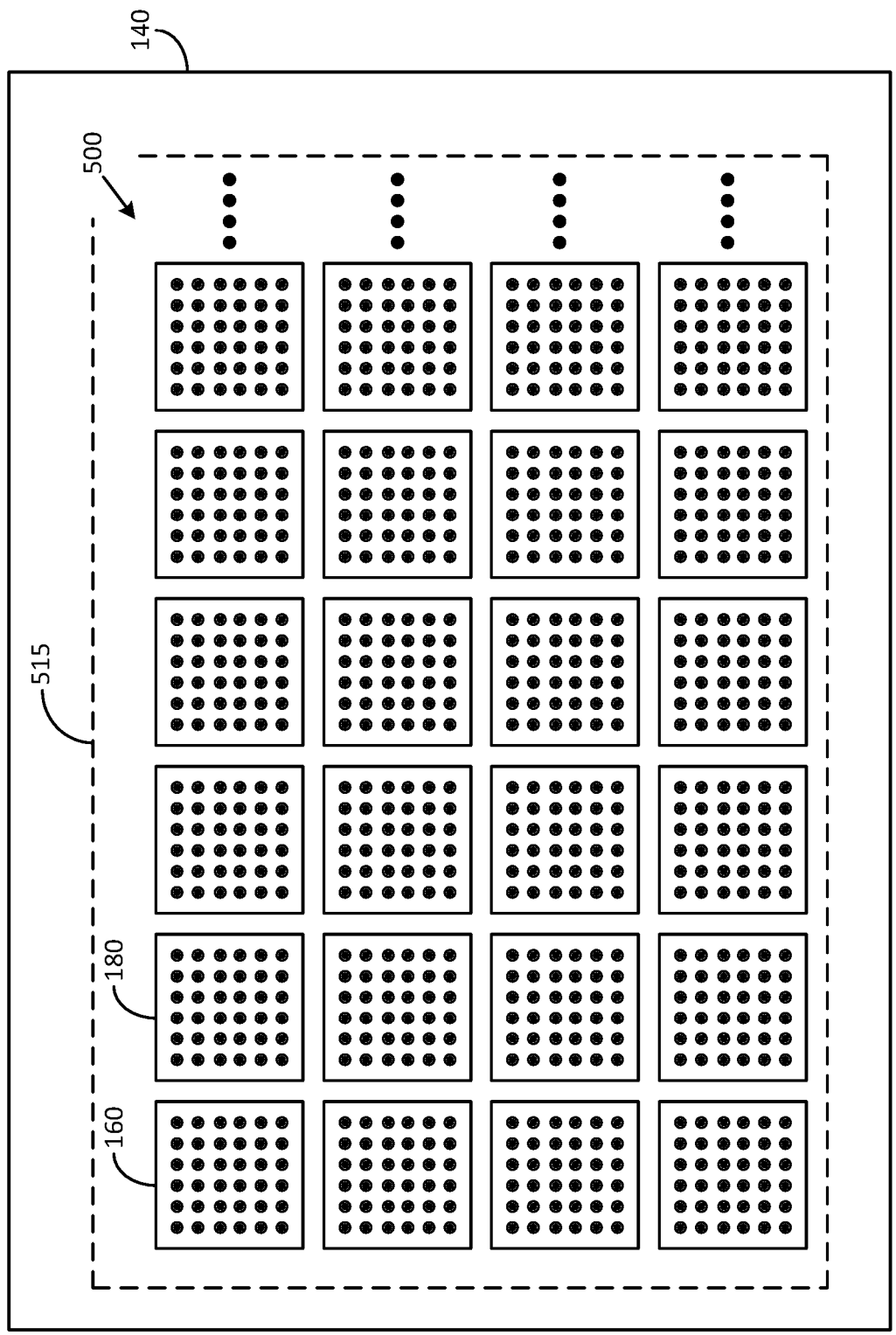
FIG. 5 shows a first exemplary arrangement of probe modules placed upon a docking plate in accordance with the disclosure.

FIG. 5 shows a first exemplary arrangement 515 of probe modules in accordance with the disclosure. In this first exemplary arrangement, a master set of probe modules 500 is adapted for placement upon the docking plate 140. The master set of probe modules 500 has "n" number of probe modules (n≥2), where "n" is equal to a maximum number of probe modules that may be placed upon the docking plate 140 in accordance with the disclosure. The maximum number "n" may be determined using various parameters, such as one or more characteristics of the printed circuit board assembly 105 shown in FIG. 1; one or more characteristics of the testing apparatus 100; or one or more test requirements.

A few exemplary characteristics of the printed circuit board assembly 105 that may be used to determine the "n" number include: a size of the printed circuit board assembly 105; a number of solder pads of the printed circuit board assembly 105 that are to be used for testing; the distribution and layout of the solder pads to be used for testing. A few exemplary characteristics of the testing apparatus 100 that may be used to determine the "n" number of probe modules include: one or more dimensions of the docking plate 140; and the number and nature of connectors available for connecting a test instrument to the testing apparatus 100. A few exemplary characteristics of the test requirements that may be used to determine the "n" number of probe modules include: the nature of the tests to be conducted (continuity test, a first functional test, a second functional test, and so on); the number and frequency of tests to be conducted; and the characteristics of the test instruments coupled to the testing apparatus 100.

The probe modules of the master set of probe modules 500 are arranged coplanar to each other in a grid formation upon the top major surface 143 of the docking plate 140. The grid formation may be a square grid formation or a rectangular grid formation in accordance with an availability of space upon the top major surface 143 of the docking plate 140. In this exemplary implementation, each module abuts a neighboring module along each of a row and a column of the grid formation.

The master set of probe modules 500 may be placed upon the top major surface 143 of the docking plate 140 in various ways. In a first exemplary embodiment, each of the master set of probe modules 500 is adapted for manual placement upon the top major surface 143 of the docking plate 140. Each probe module and/or the docking plate 140 may include various elements that assist in the manual placement of the probe modules upon the top major surface 143 of the docking plate 140. For example, fiducials, grid markings, location markers, barriers, and/or indentations may be provided on the top major surface 143 of the docking plate 140 in various exemplary implementations.

In a second exemplary embodiment, each of the master set of probe modules 500 is adapted for automated placement upon the docking plate 140. The automated placement may be carried out under control of the electro-magnetic levitation system 305 for example.

Each of the master set of probe modules 500 may support one or more probes. The number of probes supported in each of the probe modules may be identical (as shown) or may vary from one probe module to another. When a probe module is accurately placed at upon the top major surface 143 of the docking plate 140, the probes on the module are automatically aligned with the set of perforations extending from the bottom major surface 112 of the mounting plate 110 to the top major surface 111 of the mounting plate 110.

Figure 6:
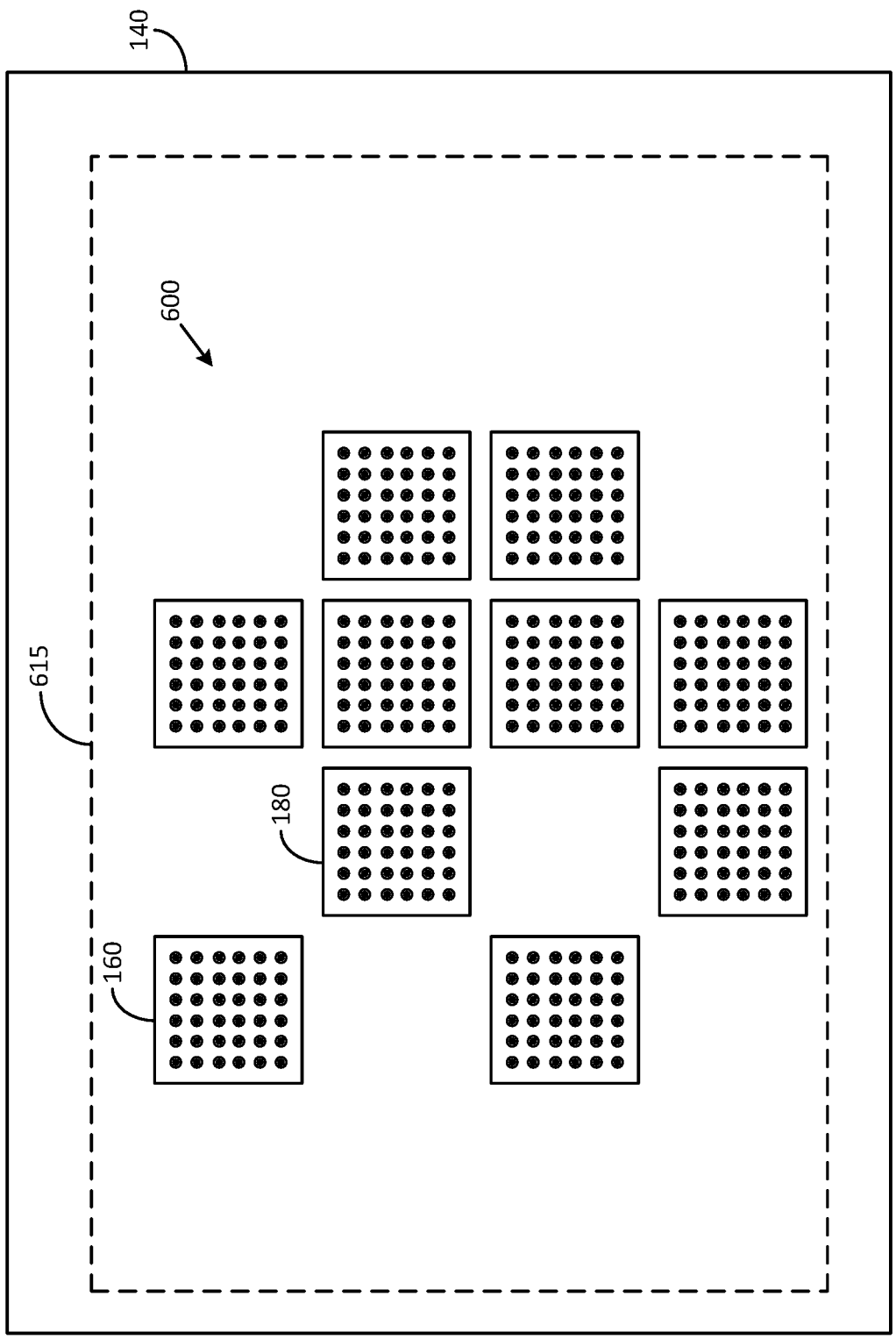
FIG. 6 shows a second exemplary arrangement of probe modules placed upon a docking plate in accordance with the disclosure.

FIG. 6 shows a second exemplary arrangement 615 of probe modules in accordance with the disclosure. This second exemplary implementation includes a first subset of probe modules 600 adapted for placement upon the docking plate 140. The first subset of probe modules 600 has "(n−m)" modules, where n>m≥1. In one exemplary embodiment, the first subset of probe modules 600 includes the first probe module 160 and the second probe module 180. The probe modules of the first subset of probe modules 600 are arranged coplanar to each other in the same grid formation as used in the master set of probe modules 500 shown in FIG. 5. The "m" probe modules that are omitted from the master set of probe modules 500 may be determined using various parameters, such as one or more characteristics of the printed circuit board assembly 105 that is under test, and one or more test requirements.

A few exemplary characteristics of the printed circuit board assembly 105 that may be used to determine the "m" number include: a number of solder pads of the printed circuit board assembly 105 that are to be used for testing; and the distribution and layout of these solder pads. A few exemplary characteristics of the test requirements that may be used to determine the "m" number of probe modules include: the nature of the tests to be conducted (continuity test, a first functional test, a second functional test, and so on); the number and frequency of tests to be conducted; and the characteristics of the test instruments coupled to the testing apparatus 100.

Figure 7:
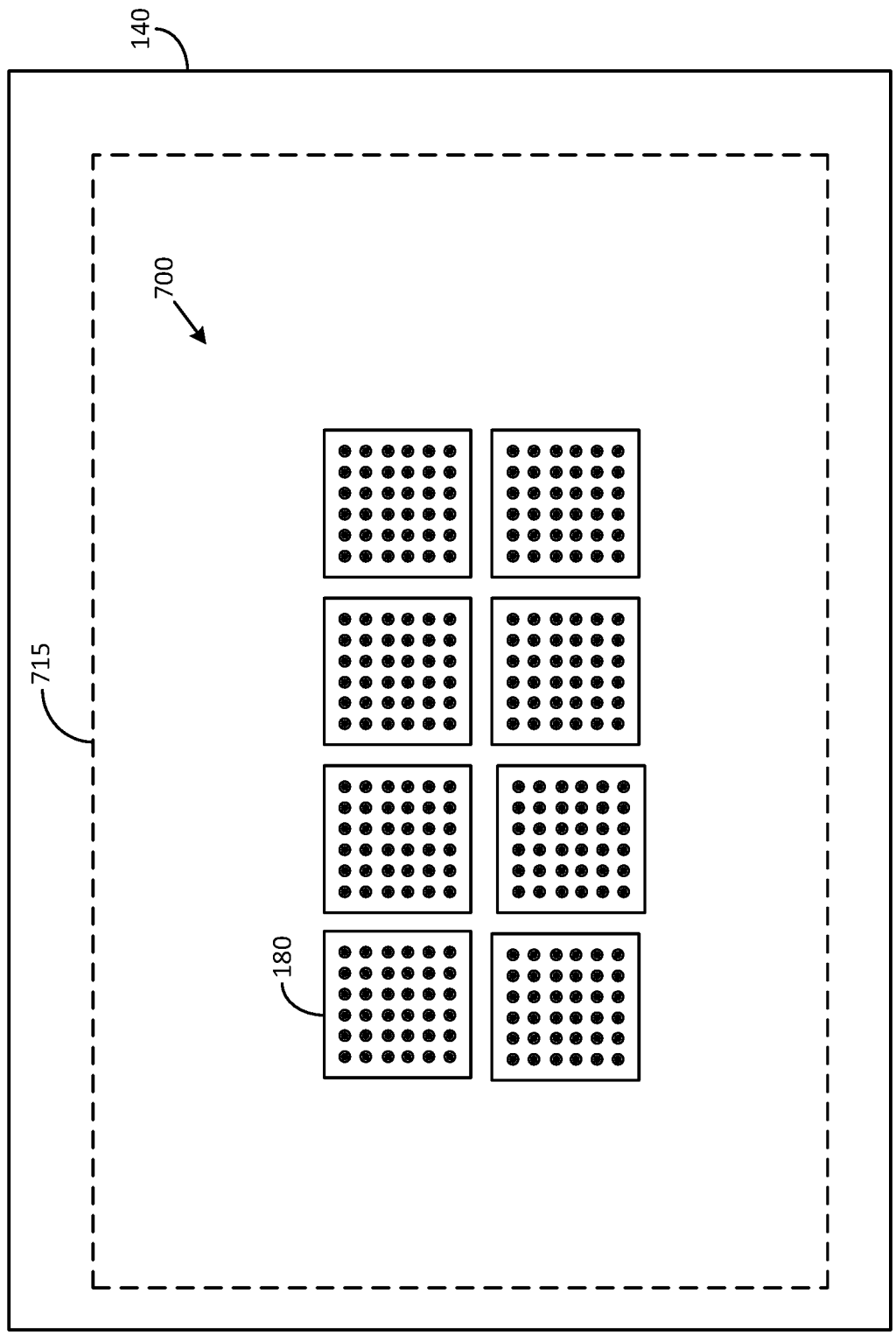
FIG. 7 shows a third exemplary arrangement of probe modules placed upon a docking plate in accordance with the disclosure.

FIG. 7 shows a third exemplary arrangement 715 of probe modules in accordance with the disclosure. This third exemplary implementation includes a second subset of probe modules 700 adapted for placement upon the top major surface 143 of the docking plate 140. The second subset of probe modules 700 has "(n−k)" modules, where n>k≥1. The probe modules of the second subset of probe modules 700 are arranged coplanar to each other in the same grid formation as used in the master set of probe modules 500 shown in FIG. 5. The "k" probe modules that are omitted from the master set of probe modules 500 may be determined using various parameters, such as one or more characteristics of the printed circuit board assembly 105 that is under test, and one or more test requirements.

A few exemplary characteristics of the printed circuit board assembly 105 that may be used to determine the "k" number include: a number of solder pads of the printed circuit board assembly 105 that are to be used for testing; and the distribution and layout of these solder pads. The printed circuit board assembly 105 that is under test in this third exemplary implementation is different than the printed circuit board assembly 105 that is under test in the second exemplary implementation described above. Consequently, the layout of the solder pads and the nature of the tests may be different in this third exemplary implementation. The arrangement of the second subset of probe modules 700 upon the top major surface 143 of the docking plate 140 is different than that of the first subset of probe modules 600 so as to accommodate the different layout of solder pads and/or different tests being conducted.

In another exemplary embodiment, the second subset of probe modules 700 does not include any of the probe modules that are included in the first subset of probe modules 500. The locations at which one or more probe modules of the second subset of probe modules 700 are placed upon the upon the top major surface 143 of the docking plate 140 may be different than that of the first subset of probe modules 600.

In yet another exemplary embodiment, the second subset of probe modules 700 includes at least one of the probe modules (for example, the second probe module 180) that is included in the first subset of probe modules 600. The locations at which one or more probe modules of the second subset of probe modules 700 are placed upon the upon the top major surface 143 of the docking plate 140 may be different than that of the first subset of probe modules 600.

Figure 8:
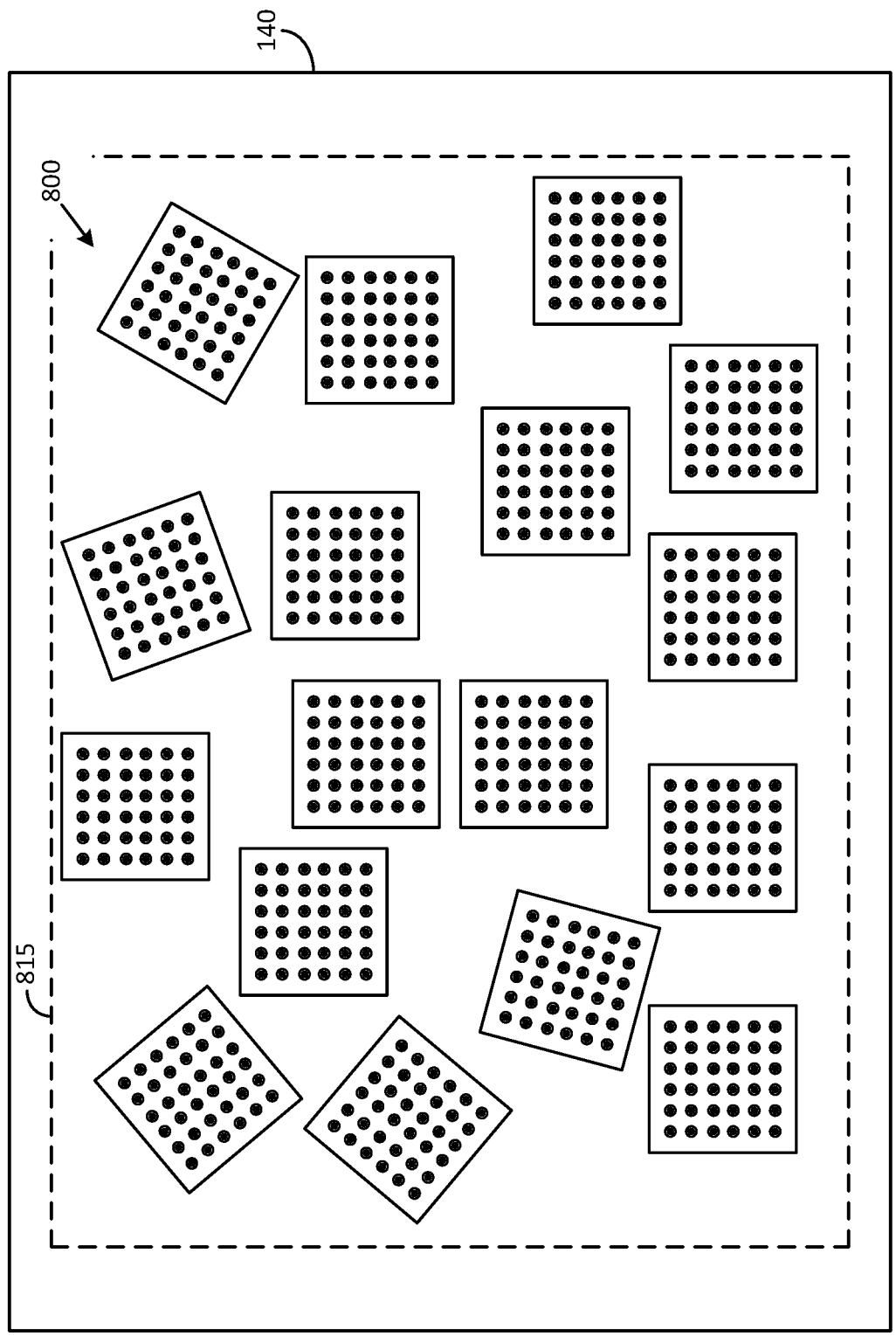
FIG. 8 shows a fourth exemplary arrangement of probe modules placed upon a docking plate in accordance with the disclosure.

FIG. 8 shows a fourth exemplary arrangement 815 of probe modules in accordance with the disclosure. This fourth exemplary implementation includes a third subset of probe modules 800 adapted for placement upon the top major surface 143 of the docking plate 140. In one exemplary embodiment, the third subset of probe modules 800 may be the same as one of the first subset of probe modules 600 or the second subset of probe modules 700. However, the arrangement of the third subset of probe modules 800 upon the top major surface 143 of the docking plate 140 is different than the grid arrangement used for the first subset of probe modules 600 or the second subset of probe modules 700. An orientation and a location of each probe module of the third subset of probe modules 800 is selected to match a layout of various solder pads on the bottom major surface 107 of the printed circuit board assembly 105 under test. In another exemplary embodiment, the third subset of probe modules 800 may be different than the first subset of probe modules 600 and the second subset of probe modules 700.

Figure 9:
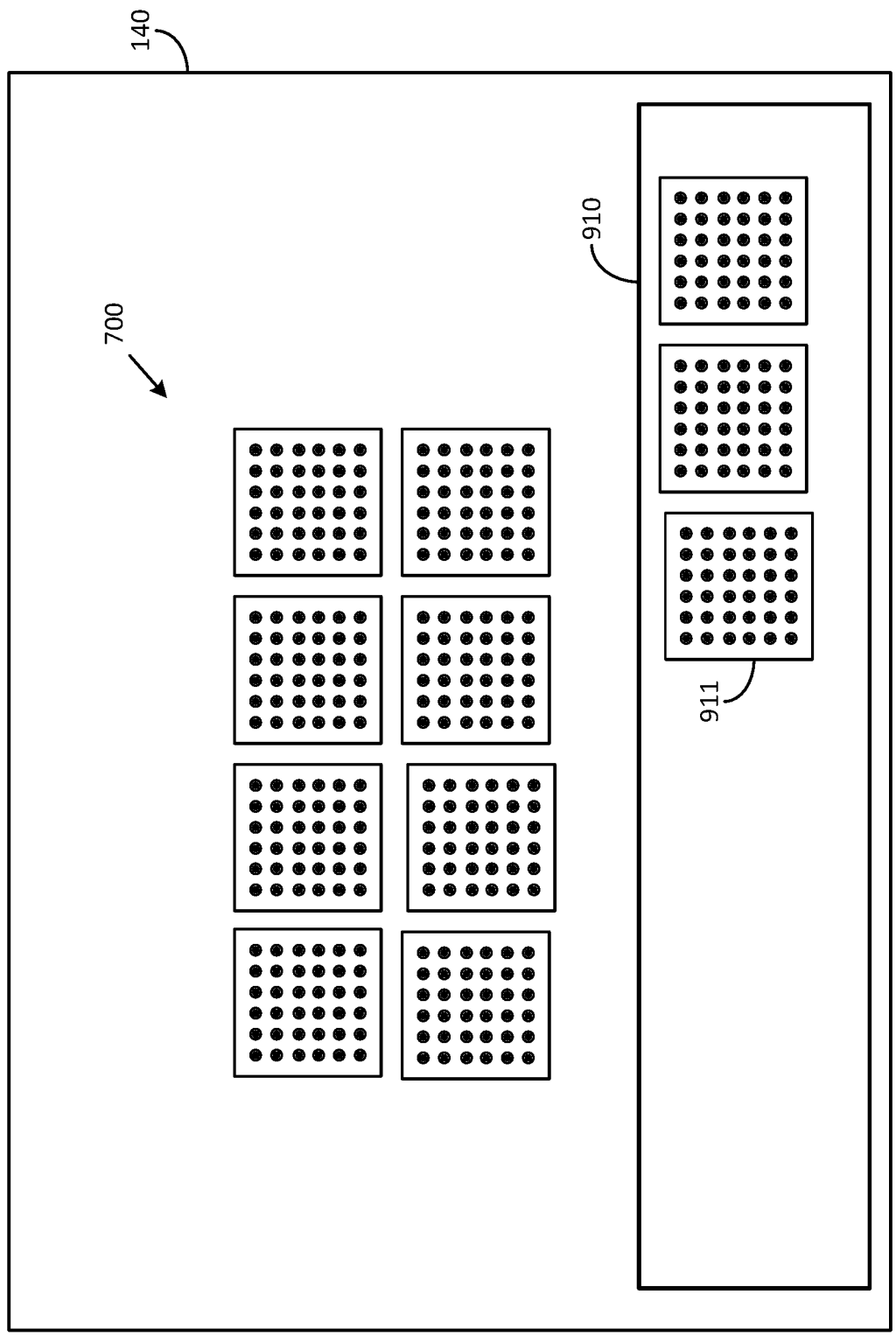
FIG. 9 shows an exemplary docking arrangement for unused probe modules in accordance with the disclosure.

FIG. 9 shows an exemplary docking arrangement for unused probe modules in accordance with the disclosure. In this exemplary docking arrangement, the second subset of probe modules 700 is placed upon the upon the top major surface 143 of the docking plate 140 in the third exemplary arrangement 715 described above. The probe modules of the master set of probe modules 500 that are unused in the third exemplary arrangement 715 may be parked in a designated parking area 910 upon the upon the top major surface 143 of the docking plate 140. Unused probe module 911 is one example of an unused probe module that is parked in the designated parking area 910. The designated parking area 910 may be determined using various parameters, such as one or more characteristics of the printed circuit board assembly 105 that is under test and/or one or more components of the testing apparatus 100.

A few exemplary characteristics of the printed circuit board assembly 105 that may be used to determine the parking area 910 may include a dimension of the printed circuit board assembly 105. The parking area 910 may be placed outside of a footprint that is defined upon the top major surface 143 of the docking plate 140 by the dimension of the printed circuit board assembly 105. A few exemplary characteristics of a component of the testing apparatus 100 may include the characteristics of the electro-magnetic levitation system 305 that defines a useable levitation area upon the top major surface 143 of the docking plate 140.

Figure 10:
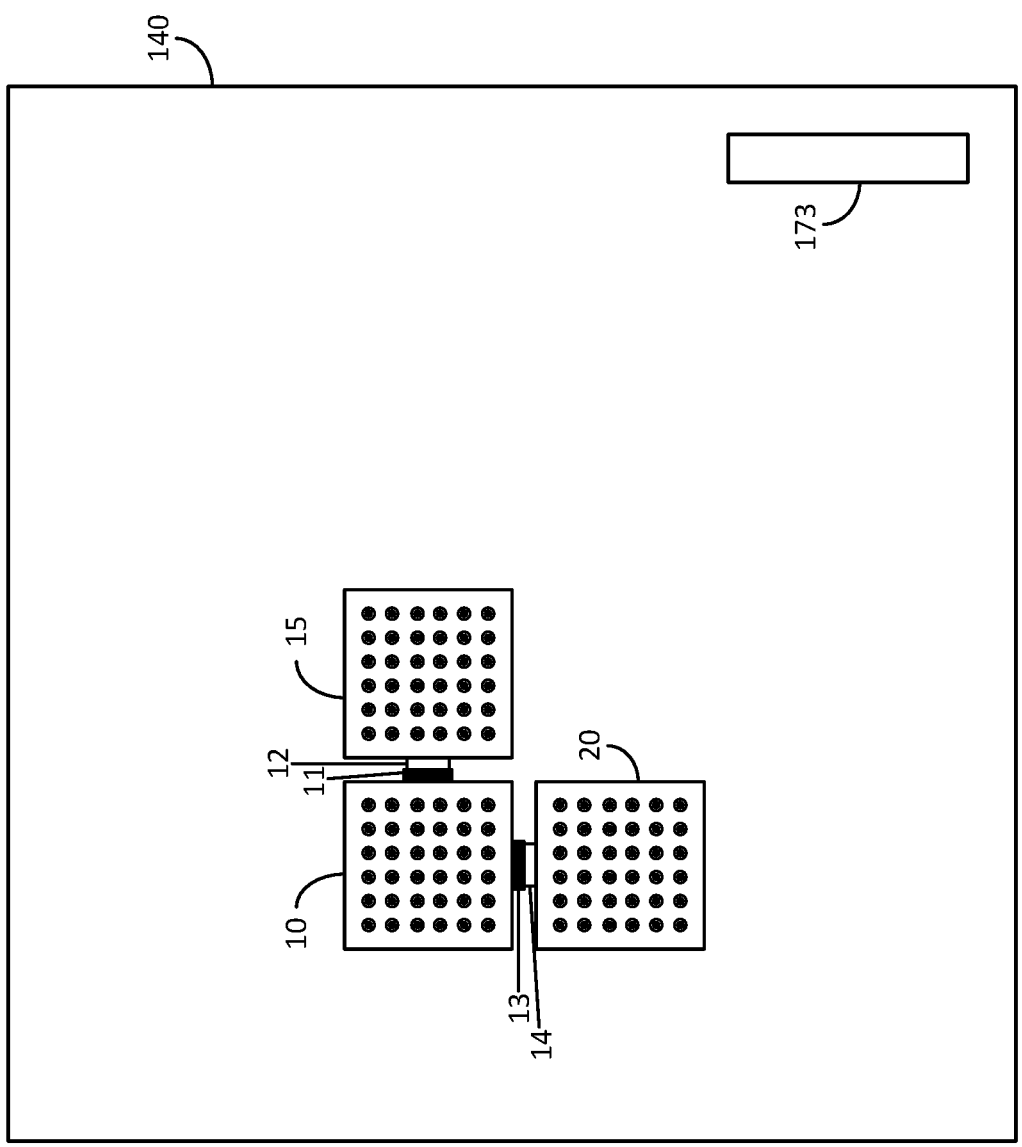
FIG. 10 shows an exemplary set of interconnected probe modules placed upon a docking plate in accordance with an embodiment of the disclosure.

FIG. 10 shows an exemplary set of interconnected probe modules placed upon the docking plate 140 in accordance with an embodiment of the disclosure. The set of interconnected probe modules includes a first probe module 10, a second probe module 15, and a third probe module 20. The first probe module 10 has a first connector 11 mounted upon a first wall and a second connector 13 mounted upon a second wall that is orthogonal to the first wall. The second probe module 15 has a connector 12 mounted on a wall that runs parallel to the wall of the first probe module 10 upon which the first connector 11 is mounted. The third probe module 20 has a connector 14 mounted on a wall that runs parallel to the wall of the first probe module 10 upon which the second connector 13 is mounted.

The connector 12 of the second probe module 15 is configured to mate with the first connector 11 of the first probe module 10 in an arrangement whereby the second probe module 15 is connected to, and neighboring, the first probe module 10 upon the docking plate 140. The connector 14 of the third probe module 20 is configured to mate with the second connector 13 of the first probe module 10 in an arrangement whereby the third probe module 20 is also connected to, and neighboring, the first probe module 10 upon the docking plate 140.

In one exemplary implementation, the connector 12 is directly plugged into the first connector 11, and the connector 14 is directly plugged into the second connector 13. In another exemplary implementation, a first interconnecting cable is used to connect the connector 12 to the first connector 11, and a second interconnecting cable is used to connect the connector 14 to the second connector 13.

In summary, it should be noted that the invention has been described with reference to a few illustrative embodiments for the purpose of demonstrating the principles and concepts of the invention. It will be understood by persons of skill in the art, in view of the description provided herein, that the invention is not limited to these illustrative embodiments. Persons of skill in the art will understand that many such variations can be made to the illustrative embodiments without deviating from the scope of the invention.

What is claimed is:

1. A testing apparatus, comprising:
a mounting plate having a top major surface adapted for removably mounting a printed circuit board assembly, the mounting plate comprising a first set of perforations extending from the top major surface of the mounting plate to a bottom major surface of the mounting plate;
a base plate configured to support the mounting plate on one or more support members that extend between the bottom major surface of the mounting plate and a top major surface of the base plate;
a docking plate mounted upon the base plate, the docking plate comprising a second set of perforations extending from a top major surface of the docking plate to a bottom major surface of the mounting plate; and
a first probe module comprising:
a first enclosure comprising a first connector mounted upon a first wall of the first enclosure, the first connector having a set of leads exposed to an interior portion of the first enclosure and a corresponding set of contacts exposed outside the first enclosure;
a first probe plate operative as a top cover of the first enclosure, the first probe plate supporting a first set of probes, the first set of probes including at least one probe comprising:
a probe pin having a proximal end arranged to pass through a first perforation in the first set of perforations in the mounting plate and touch a first test point on a bottom major surface of the printed circuit board assembly; and
a connecting wire connected between a distal end of the probe pin and a first lead in the set of leads of the first connector; and
a bottom cover attached to a bottom portion of the first enclosure, the bottom cover including two alignment pegs arranged to pass through a first pair of perforations in the second set of perforations in the docking plate for alignedly mounting the first probe module upon the docking plate.

2. The testing apparatus of claim 1, further comprising:
a second probe module comprising:
a second enclosure comprising a second connector that is mounted upon a first wall of the second enclosure, the second connector having a set of leads exposed to an interior portion of the second enclosure and a corresponding set of contacts exposed outside the second enclosure;
a second probe plate operative as a top cover of the second enclosure, the second probe plate supporting a second set of probes, the second set of probes including at least one probe comprising:
a probe pin having a proximal end arranged to pass through a second perforation in the first set of perforations in the mounting plate and touch a second test point on the bottom major surface of the printed circuit board assembly; and
a connecting wire connected between a distal end of the probe pin and a lead in the set of leads of the second connector; and
a bottom cover attached to a bottom portion of the second enclosure, the bottom cover including two alignment pegs arranged to pass through a second pair of perforations in the second set of perforations in the docking plate for alignedly mounting the second probe module upon the docking plate.

3. The testing apparatus of claim 2, wherein the second connector mounted upon the first wall of the second enclosure is configured to mate with the first connector mounted upon the first wall of the first enclosure in an arrangement whereby the first probe module is connected to, and neighboring, the second probe module upon the docking plate.

4. The testing apparatus of claim 3, wherein: the first enclosure of the first probe module further comprises a third connector that is mounted upon a second wall of the first enclosure, the third connector having a set of leads exposed to an interior portion of the first enclosure and a corresponding set of contacts exposed outside the first enclosure.

5. The testing apparatus of claim 4, further comprising:
a third probe module comprising:
a third enclosure comprising a fourth connector that is mounted upon a first wall of the third enclosure, the fourth connector having a set of leads exposed to an interior portion of the third enclosure and a corresponding set of contacts exposed outside the third enclosure;
a third probe plate operative as a top cover of the third enclosure, the third probe plate supporting a third set of probes, the third set of probes including at least one probe comprising:
a probe pin having a proximal end arranged to pass through a third perforation in the first set of perforations in the mounting plate and touch a third test point on the bottom major surface of the printed circuit board assembly; and
a connecting wire connected between a distal end of the probe pin and a lead in the set of leads of the fourth connector; and
a bottom cover attached to a bottom portion of the third enclosure, the bottom cover including two alignment pegs arranged to pass through a third pair of perforations in the second set of perforations in the docking plate for alignedly mounting the third probe module upon the docking plate.

6. The testing apparatus of claim 5, wherein the fourth connector mounted upon the first wall of the third enclosure is configured to mate with the third connector that is mounted upon the second wall of the first enclosure whereby the third probe module is connected to, and neighboring, the first probe module upon the docking plate.

7. A testing apparatus, comprising:
a first probe module comprising:
a first enclosure comprising a first connector mounted upon a first wall of the first enclosure, the first connector having a set of leads exposed to an interior portion of the first enclosure and a corresponding set of contacts exposed outside the first enclosure; and
a first probe plate operative as a top cover of the first enclosure, the first probe plate supporting a first set of probes, the first set of probes including at least a first probe comprising:
a probe pin having a proximal end arranged to pass through a first perforation in a first set of perforations in a mounting plate and touch a first test point on a bottom major surface of a printed circuit board assembly that is mounted upon the mounting plate; and
a connecting wire connected between a distal end of the probe pin and a first lead in the set of leads of the first connector.

8. The testing apparatus of claim 7, further comprising:
a base plate configured to support the mounting plate on one or more support members; and
a docking plate mounted upon the base plate.

9. The testing apparatus of claim 8, wherein the docking plate comprises a set of perforations extending from a top major surface of the docking plate to a bottom major surface of the docking plate, and wherein the first probe module further includes a bottom cover that is attached to a bottom portion of the first enclosure, the bottom cover including two alignment pegs arranged to pass through a first pair of perforations in the set of perforations in the docking plate for alignedly mounting the first probe module upon the docking plate.

10. The testing apparatus of claim 9, further comprising:
a second probe module comprising:
a second enclosure comprising a second connector that is mounted upon a first wall of the second enclosure, the second connector having a set of leads exposed to an interior portion of the second enclosure and a corresponding set of contacts exposed outside the second enclosure;
a second probe plate operative as a top cover of the second enclosure, the second probe plate supporting a second set of probes, the second set of probes including at least one probe comprising:
a probe pin having a proximal end arranged to pass through a second perforation in the first set of perforations in the mounting plate and touch a second test point on the bottom major surface of the printed circuit board assembly; and
a connecting wire connected between a distal end of the probe pin and a lead in the set of leads of the second connector; and
a bottom cover attached to a bottom portion of the second enclosure, the bottom cover including two alignment pegs arranged to pass through a second pair of perforations in the set of perforations in the docking plate for alignedly mounting the second probe module upon the docking plate.

11. The testing apparatus of claim 10, wherein the second connector mounted upon the first wall of the second enclosure is configured to mate with the first connector mounted upon the first wall of the first enclosure in an arrangement whereby the first probe module is connected to, and neighboring, the second probe module upon the docking plate.

12. The testing apparatus of claim 8, further comprising:
an electromagnetic levitation system operable to place at least the first probe module in a hovering state above a top major surface of the docking plate.

13. The testing apparatus of claim 12, wherein the docking plate includes a designated parking area for parking one or more unused probe modules.

14. The testing apparatus of claim 8, further comprising:
a second connector mounted upon the docking plate, the second connector adapted to engage with a third connector that is a part of a test instrument; and
one or more connecting wires connecting the first connector that is mounted upon the first wall of the first enclosure to the second connector mounted upon the docking plate.

15. A method comprising:
placing a printed circuit board assembly upon a top major surface of a mounting plate that is a part of a testing apparatus;
placing a first probe module upon a docking plate that is located below the mounting plate;
moving down the mounting plate, whereby a proximal end of a probe pin of a first probe that is mounted in a top cover of the first probe module passes through a first perforation in the mounting plate and touches a first test point on a bottom major surface of the printed circuit board assembly; and
executing a first test procedure upon the printed circuit board assembly, the first test procedure comprising propagating one or more test signals through at least the probe pin of the first probe to the printed circuit board assembly, wherein placing the first probe module upon the docking plate comprises inserting two alignment pegs that are located in a bottom cover of the first probe module into a pair of perforations in the docking plate.

16. The method of claim 15, wherein the top cover is a part of an enclosure having a first connector mounted upon a first wall, the first connector having a set of leads exposed to an interior portion of the enclosure and a corresponding set of contacts exposed outside the enclosure.

17. The method of claim 15, wherein the two alignment pegs are located diagonally opposed to each other in the bottom cover of the first probe module.

18. The method of claim 15, wherein placing the first probe module upon the docking plate comprises utilizing an electro-magnetic levitation system to place the first probe module in a hovering state above a top major surface of the docking plate.

19. The method of claim 18, further comprising placing one or more unused probe modules in a designated parking area upon the top major surface of the docking plate.

* * * * *